US012575358B2

(12) United States Patent (10) Patent No.: US 12,575,358 B2
Shin et al. (45) Date of Patent: Mar. 10, 2026

(54) FLOW RESISTANCE GENERATING UNIT AND SUBSTRATE TREATING APPARATUS INCLUDING THE SAME

(71) Applicant: SEMES CO., LTD., Chungcheongnam-do (KR)

(72) Inventors: Jae Won Shin, Gyeonggi-do (KR); Jae Seong Lee, Gyeonggi-do (KR); Hae Won Choi, Daejeon (KR); Joon Ho Won, Gyeonggi-do (KR); Koriakin Anton, Chungcheongnam-do (KR); Min Woo Kim, Seoul (KR); Hyung Seok Kang, Gyeonggi-do (KR); Eung Su Kim, Gyeonggi-do (KR); Pil Kyun Heo, Gyeonggi-do (KR); Jin Yeong Sung, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 859 days.

(21) Appl. No.: 17/865,386

(22) Filed: Jul. 15, 2022

(65) Prior Publication Data

US 2023/0113184 A1 Apr. 13, 2023

(30) Foreign Application Priority Data

Oct. 8, 2021 (KR) ........................ 10-2021-0134392

(51) Int. Cl.
*H01L 21/67* (2006.01)
(52) U.S. Cl.
CPC .............................. *H01L 21/67034* (2013.01)
(58) Field of Classification Search
CPC ............... F26B 5/005; H01L 21/67034; H01L 21/67017; H01L 21/67103; H01L 21/6719; H01L 21/67098; H01L 21/6875
See application file for complete search history.

(56) References Cited

U.S. PATENT DOCUMENTS 9,587,880 B2 3/2017 Kim et al.
10,796,897 B2 10/2020 Kiyohara
(Continued)

FOREIGN PATENT DOCUMENTS

JP 9-260332 10/1997
JP 2013-251550 12/2013
(Continued)

OTHER PUBLICATIONS

Office Action dated Aug. 29, 2023 for Japanese Patent Application No. 2022-112958 and its English translation from Global Dossier.
(Continued)

*Primary Examiner* — Jessica Yuen
(74) *Attorney, Agent, or Firm* — WOMBLE BOND DICKINSON (US) LLP

(57) ABSTRACT

The present disclosure relates to a flow resistance generating unit that generates a flow resistance in a pipe to solve a flow imbalance problem due to a bent pipe and stabilizes an internal airflow, and a substrate treating apparatus including the same. The substrate treating apparatus comprises a fluid supply unit for supplying fluid for treating a substrate and including an upper fluid supply module for supplying the fluid to an upper portion of the substrate, a lower fluid supply module for supplying the fluid to a lower portion of the substrate, and a supply pipe connected to at least one of the upper fluid supply module and the lower fluid supply module, and a flow resistance generating unit installed in the supply pipe and for generating a flow resistance with respect to the fluid passing through the supply pipe.

19 Claims, 10 Drawing Sheets

(56)                    References Cited

U.S. PATENT DOCUMENTS

| | | | |
|---|---|---|---|
| 11,621,174 | B2 | 4/2023 | Sumi et al. |
| 12,287,147 | B2 | 4/2025 | Park et al. |
| 2013/0318812 | A1* | 12/2013 | Kim .................. H01L 21/67017 |
| | | | 34/201 |
| 2022/0325953 | A1* | 10/2022 | Park .................. H01L 21/67103 |
| 2025/0224177 | A1 | 7/2025 | Park et al. |

FOREIGN PATENT DOCUMENTS

| | | |
|---|---|---|
| JP | 2018-93110 | 6/2018 |
| KR | 10-2001-0101946 | 11/2001 |
| KR | 10-2013-0100085 | 9/2013 |
| KR | 10-2014-0037582 | 3/2014 |
| KR | 10-2018-0064985 | 6/2018 |
| KR | 10-2018-0136863 | 12/2018 |
| KR | 10-2021-0001979 | 1/2021 |
| KR | 10-2022-0138294 | 10/2022 |

OTHER PUBLICATIONS

Office Action dated Apr. 4, 2025 for Korean Patent Application No. 10-2021-0134392 and its English translation from Global Dossier.
Office Action dated Dec. 26, 2025 for Korean Patent Application No. 10-2021-0134392 and its English translation from Global Dossier.

* cited by examiner

[FIG. 1]
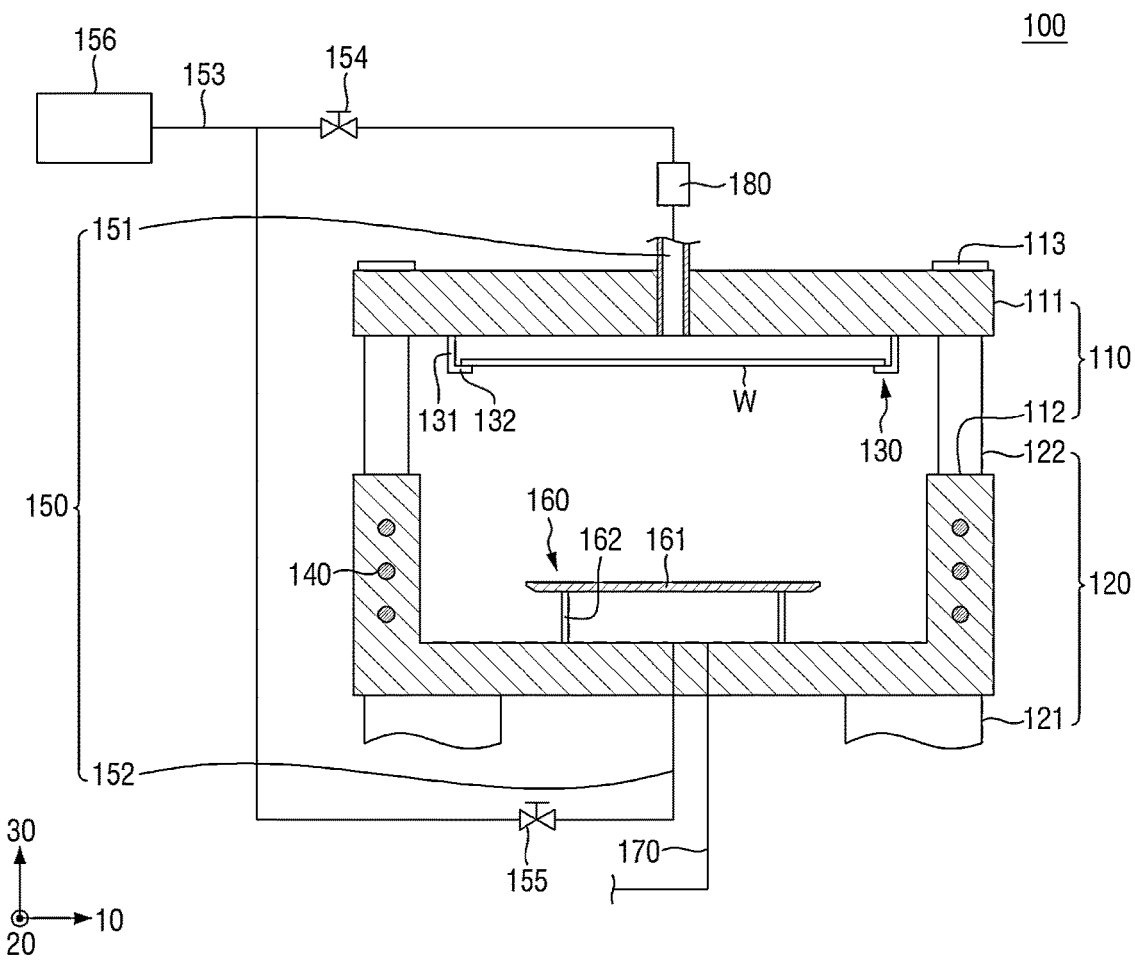

[FIG. 2]
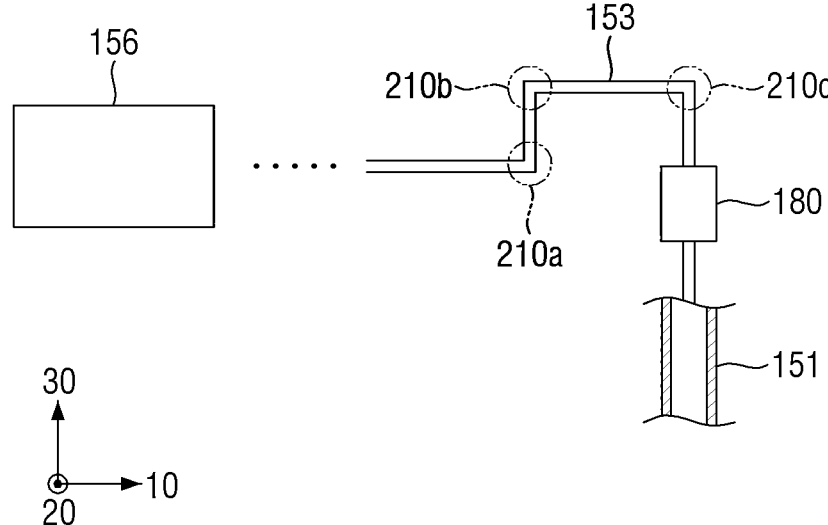
[FIG. 3]
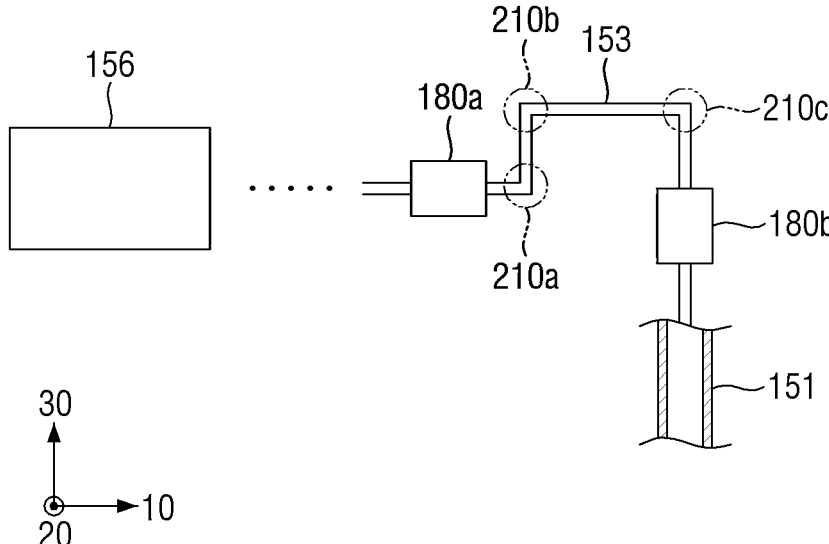

[FIG. 4]
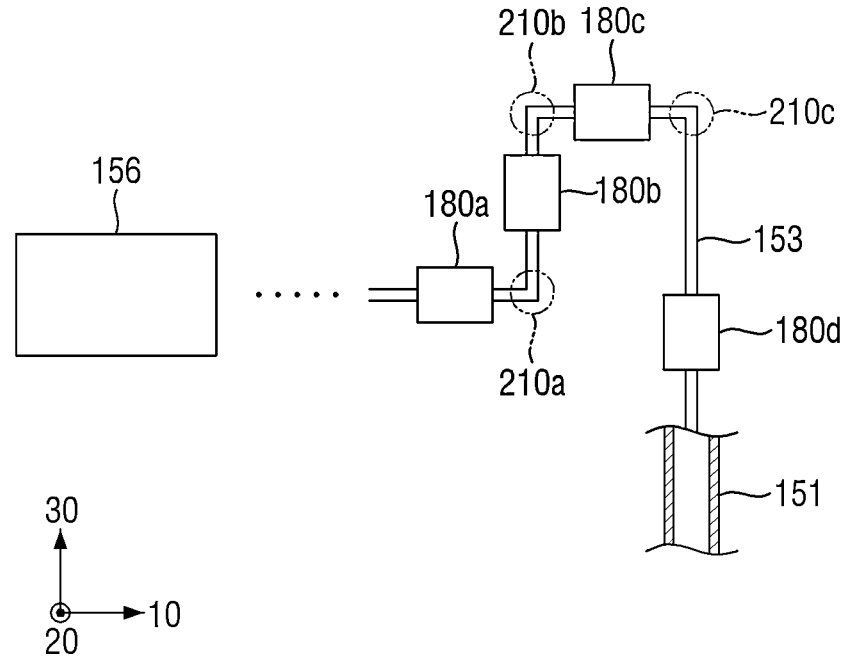
[FIG. 5]
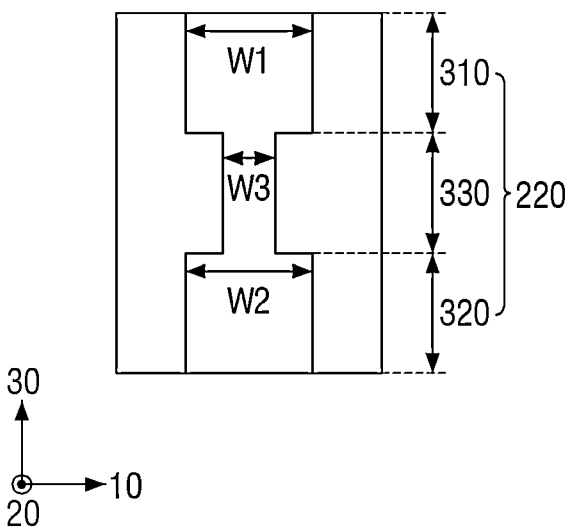

[FIG. 6]
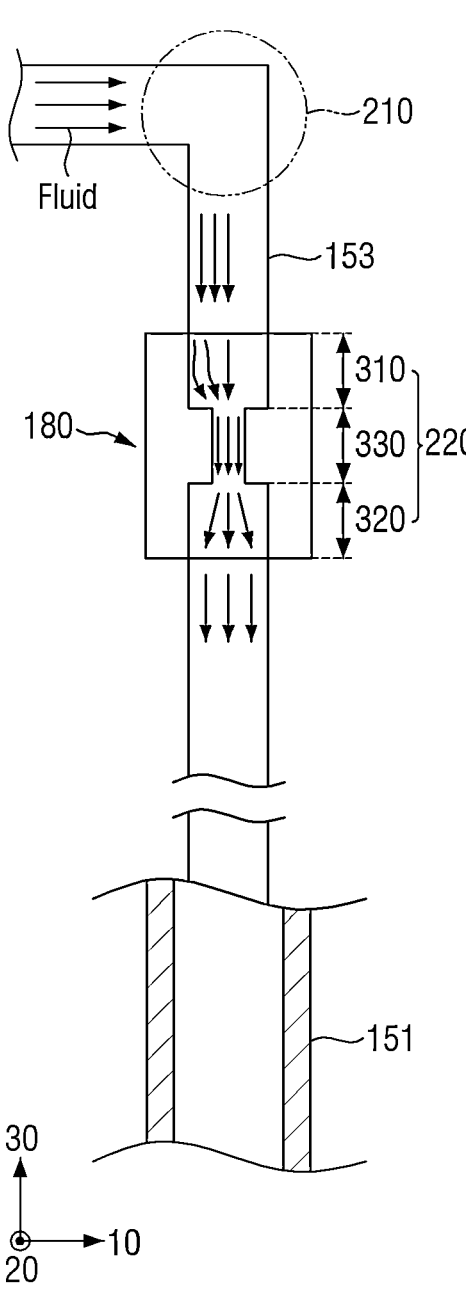

[FIG. 7]
<u>180</u>
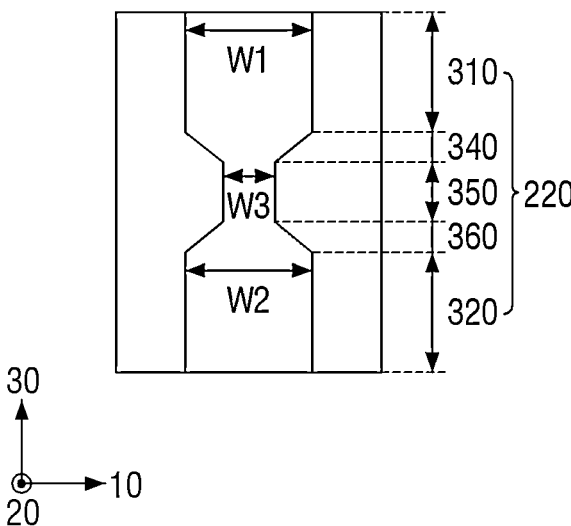

[FIG. 8]
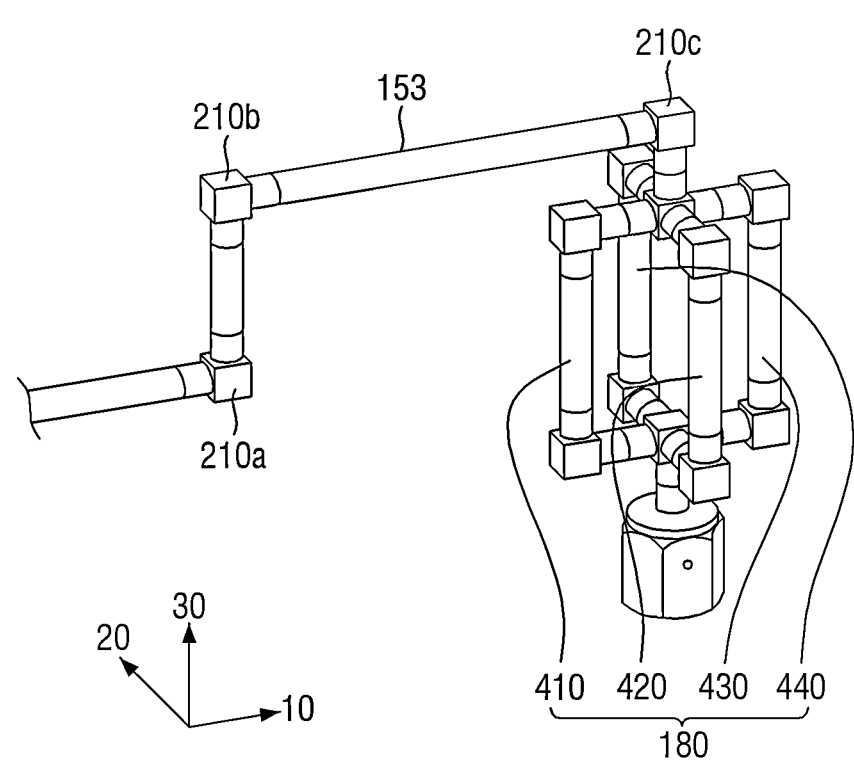

[FIG. 9]
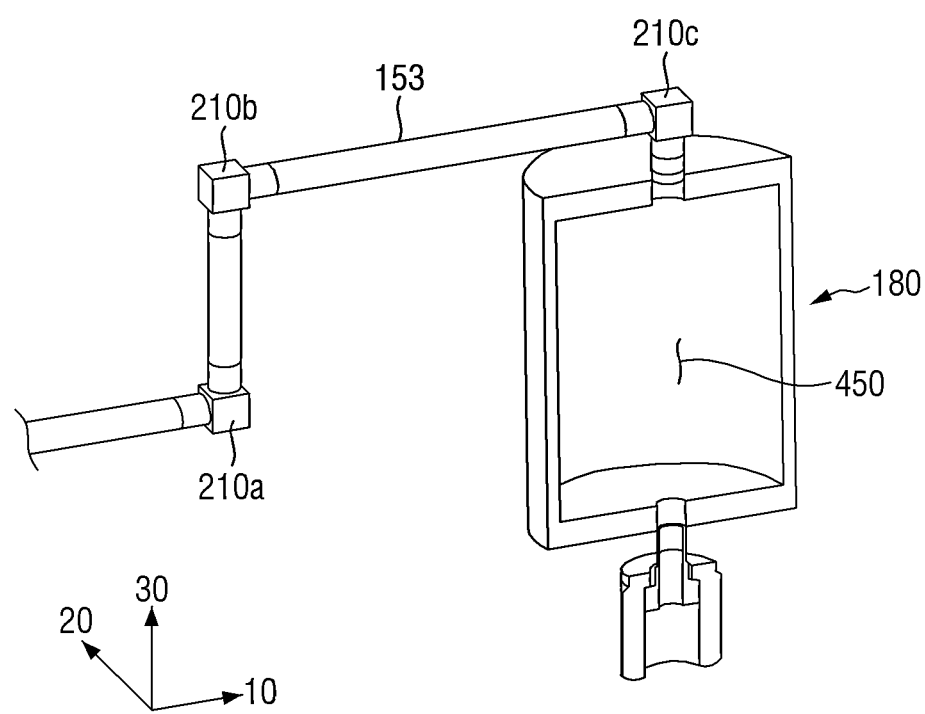

[FIG. 10]
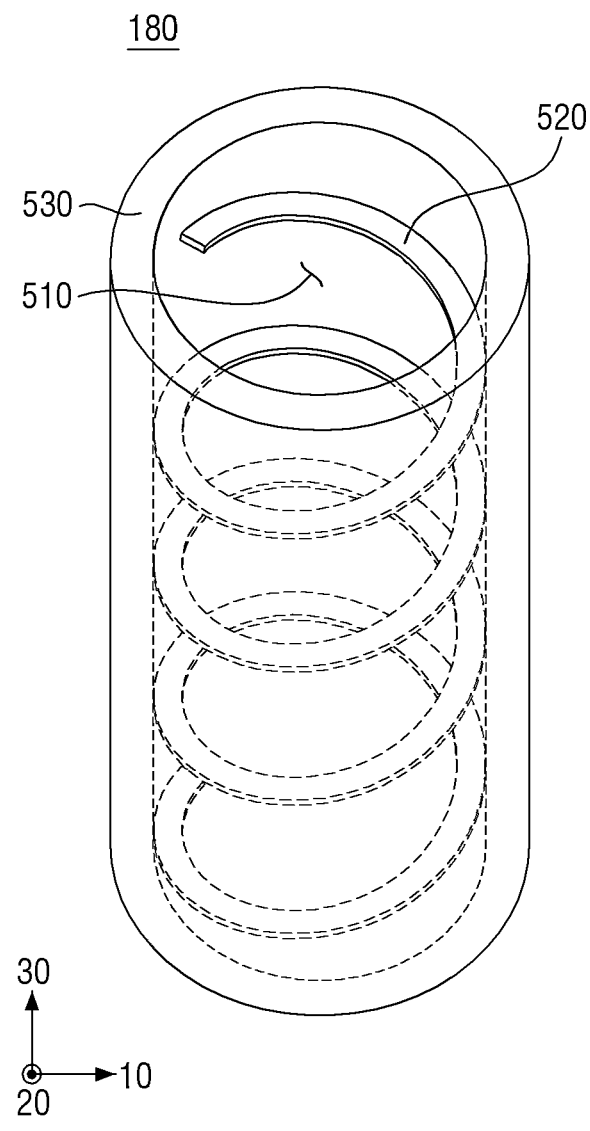

[FIG. 11]
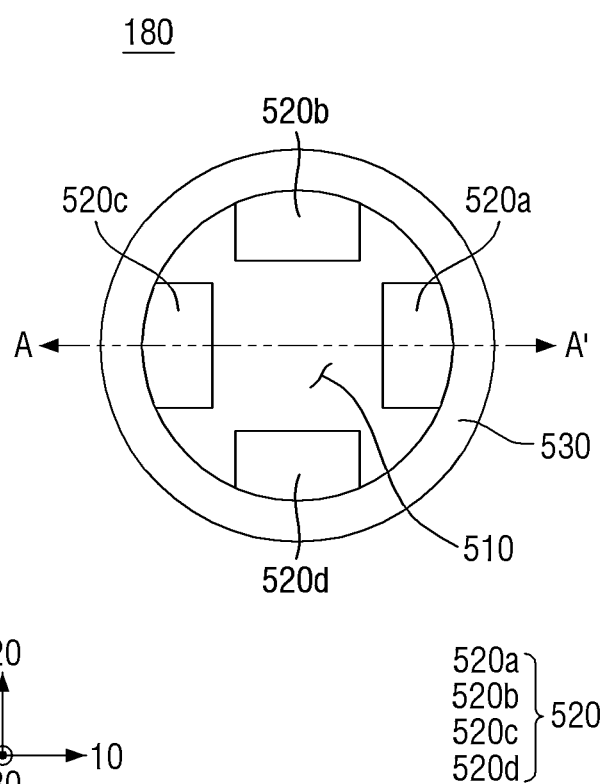

[FIG. 12]
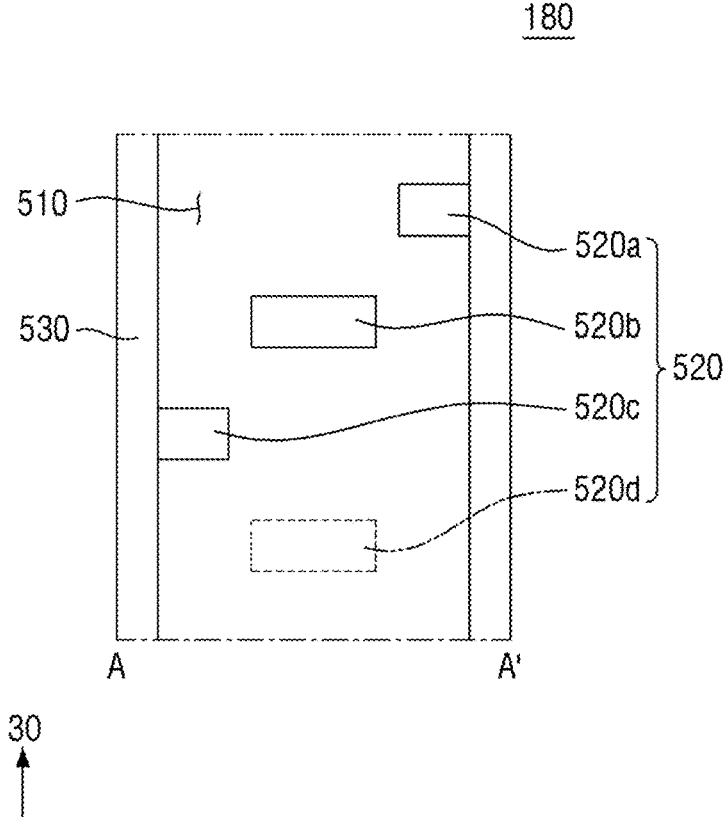

FLOW RESISTANCE GENERATING UNIT AND SUBSTRATE TREATING APPARATUS INCLUDING THE SAME

This application claims the benefit of Korean Patent Application No. 10-2021-0134392, filed on Oct. 8, 2021, in the Korean Intellectual Property Office, the disclosure of which is incorporated herein by reference in its entirety.

BACKGROUND

1. Field

The present disclosure relates to a flow resistance generating unit and a substrate treating apparatus including the same. More particularly, it relates to a flow resistance generating unit that can be applied when cleaning a substrate for manufacturing a semiconductor device, and a substrate treating apparatus including the same.

2. Description of the Related Art

The semiconductor device manufacturing process may be continuously performed in a semiconductor device manufacturing facility, and may be divided into a pre-process and a post-process. The semiconductor device manufacturing facility may be installed in a space defined as a FAB to manufacture a semiconductor device.

The pre-process refers to a process of forming a circuit pattern on a wafer to complete a chip. The pre-process may include a deposition process that forms a thin film on the wafer, a photo lithography process that transfers photo resist onto the thin film using a photo mask, an etching process that selectively removes unnecessary parts using chemical substances or reactive gases to from a desired circuit pattern on the wafer, an ashing process that removes the photoresist remaining after etching, and an ion implantation process that implants ions into a part connected to the circuit pattern to have characteristics of an electronic device, a cleaning process that removes contaminants from the wafer, and the like.

The post-process refers to the process of evaluating the performance of the product finished through the pre-process. The post-process may include the primary inspection process for selecting good and bad products by inspecting the operation of each chip on the wafer, the package process for cutting and separating each chip to form the shape of the product through dicing, die bonding, wire bonding, molding, and marking, and the final inspection process for finally inspecting product characteristics and reliability through electrical characteristic inspection, and burn-in inspection.

SUMMARY

The cleaning process may be performed sequentially through a process of removing foreign substances on the substrate with a chemical, a process of washing the chemical with pure water (e.g., DI (De-Ionized) Water), and a process of drying the substrate.

In the case of a process of drying the substrate, the substrate may be treated by supplying supercritical fluid to the inside of a vessel having the substrate disposed therein. However, the pipe, through which the supercritical fluid is supplied to the vessel, is composed of several bent pipes. Therefore, the flow imbalance of the supercritical fluid occurs in the pipe by the bent pipe, and the flow imbalance occurs at the discharge unit in the vessel.

In addition, due to this phenomenon, the drying of the developer applied to the substrate in the vessel is non-uniformly dried due to the unbalanced flow field, which causes converging particles to be generated.

An object of the present disclosure is to provide a flow resistance generating unit installed in a pipe for stabilizing an internal airflow, and a substrate treating apparatus including the same.

The objects of the present disclosure are not limited to the objects mentioned above, and other objects not mentioned will be clearly understood by those skilled in the art from the following description.

One aspect of the substrate treating apparatus of the present disclosure for achieving the above technical object comprises a housing, a support unit installed in the housing and for supporting a substrate from both sides, a heating member installed on a sidewall of the housing and for generating heat for treating the substrate, a fluid supply unit for supplying fluid for treating the substrate to an inside of the housing and including an upper fluid supply module for supplying the fluid to an upper portion of the substrate, a lower fluid supply module for supplying the fluid to a lower portion of the substrate, and a supply pipe connected to at least one of the upper fluid supply module and the lower fluid supply module, and a flow resistance generating unit installed in the supply pipe and for generating a flow resistance with respect to the fluid passing through the supply pipe, wherein the flow resistance generating unit is provided between a bent pipe included in the supply pipe and the upper fluid supply module, or is provided between the bent pipe and the lower fluid supply module.

Wherein the flow resistance generating unit generates a flow resistance with respect to fluid passing through the bent pipe and directed to the upper fluid supply module or the lower fluid supply module.

Wherein the flow resistance generating unit is provided between a bent pipe adjacent to the upper fluid supply module and the upper fluid supply module in response to the bent pipe being plural, or is provided between a bent pipe adjacent to the lower fluid supply module and the lower fluid supply module in response to the bent pipe being plural.

Wherein the flow resistance generating unit generates a flow resistance with respect to the fluid by limiting a flow rate of the fluid.

Wherein the flow resistance generating units are provided in plural.

Wherein the flow resistance generating units are respectively provided before and after the bent pipe.

Wherein the flow resistance generating unit comprises a body, and an inner hole formed in an interior of the body, wherein a width of the inner hole is variable.

Wherein the inner hole includes a bottleneck section.

Wherein a width of the inner hole decreases toward a center and increases toward both ends.

Wherein the flow resistance generating unit is provided as any one of an orifice type structure, a multi-pipe type structure, and a buffer tank type structure.

Wherein, in response to the flow resistance generating unit being provided as an orifice type structure, the flow resistance generating unit has an internal hole including a bottleneck section.

Wherein, in response to the flow resistance generating unit being provided as a multi-pipe type structure, the flow resistance generating unit is rejoined after branching.

Wherein, in response to the flow resistance generating unit being provided as a buffer tank type structure, the flow resistance generating unit has an inner hole having a width greater than that of the supply pipe.

Wherein the flow resistance generating unit comprises a body, an inner hole formed inside the body, and a wing member protruding from an inner surface of the body, and the wing member rotates the fluid.

Wherein the wing member is formed to extend from one end of the body to the other end along an inner circumference of the body.

Wherein the wing member is provided in plural, and the plurality of wing members are provided to be spaced apart from an inner surface of the body, and are provided at different heights.

The substrate treating apparatus further comprises a wing member formed in an inner hole and for rotating the fluid, wherein the wing member is provided in at least one of the supply pipe, the upper fluid supply module, and the lower fluid supply module.

Wherein the fluid is a supercritical fluid.

Another aspect of the substrate treating apparatus of the present disclosure for achieving the above technical object comprises a housing, a support unit installed in the housing and for supporting a substrate from both sides, a heating member installed on a sidewall of the housing and for generating heat for treating the substrate, a fluid supply unit for supplying fluid for treating the substrate to an inside of the housing and including an upper fluid supply module for supplying the fluid to an upper portion of the substrate, a lower fluid supply module for supplying the fluid to a lower portion of the substrate, and a supply pipe connected to at least one of the upper fluid supply module and the lower fluid supply module, and a flow resistance generating unit installed in the supply pipe and for generating a flow resistance with respect to the fluid passing through the supply pipe, wherein the flow resistance generating unit is provided between a bent pipe included in the supply pipe and the upper fluid supply module and generates a flow resistance with respect to fluid passing through the bent pipe and directed to the upper fluid supply module, or is provided between the bent pipe and the lower fluid supply module and generates a flow resistance with respect to fluid passing through the bent pipe and directed to the lower fluid supply module, wherein the flow resistance generating unit is provided as any one of an orifice type structure, a multi-pipe type structure, and a buffer tank type structure, wherein, in response to the flow resistance generating unit being provided as an orifice type structure, the flow resistance generating unit has an inner hole including a bottleneck section, wherein, in response to the flow resistance generating unit being provided as a multi-pipe type structure, the flow resistance generating unit is rejoined after branching, wherein, in response to the flow resistance generating unit being provided as a buffer tank type structure, the flow resistance generating unit has an inner hole having a width greater than that of the supply pipe.

One aspect of the flow resistance generating unit of the present disclosure for achieving the above technical object comprises a body, and an inner hole formed inside the body, wherein the flow resistance generating unit is provided in a supply pipe for supplying fluid to an inside of the housing, in which a substrate is disposed, to treat the substrate, wherein the flow resistance generating unit is provided between a bent pipe included in the supply pipe and a fluid supply module installed in the housing for transferring the fluid to an upper portion and a lower portion of the substrate and generates a flow resistance to fluid passing through the bent pipe and directed to the fluid supply module, wherein the flow resistance generating unit generates a flow resistance with respect to the fluid by limiting a flow rate of the fluid through a change in a width of the inner hole.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic diagram exemplarily illustrating a structure of a substrate treating apparatus according to an embodiment of the present disclosure;

FIG. 2 is a first exemplary diagram illustrating an arrangement structure of a flow resistance generating unit constituting a substrate treating apparatus according to an embodiment of the present disclosure;

FIG. 3 is a second exemplary view for describing an arrangement structure of a flow resistance generating unit constituting a substrate treating apparatus according to an embodiment of the present disclosure;

FIG. 4 is a third exemplary view for describing an arrangement structure of a flow resistance generating unit constituting a substrate treating apparatus according to an embodiment of the present disclosure;

FIG. 5 is a first exemplary view for describing a shape of a flow resistance generating unit constituting a substrate treating apparatus according to an embodiment of the present disclosure;

FIG. 6 is an exemplary view for describing an effect of a flow resistance generating unit constituting a substrate treating apparatus according to an embodiment of the present disclosure;

FIG. 7 is a second exemplary view for describing a shape of a flow resistance generating unit constituting a substrate treating apparatus according to an embodiment of the present disclosure;

FIG. 8 is a third exemplary view for describing a shape of a flow resistance generating unit constituting a substrate treating apparatus according to an embodiment of the present disclosure;

FIG. 9 is a fourth exemplary view for describing a shape of a flow resistance generating unit constituting a substrate treating apparatus according to an embodiment of the present disclosure;

FIG. 10 is a first exemplary view for describing a shape of a flow resistance generating unit constituting a substrate treating apparatus according to an embodiment of the present disclosure when the flow resistance generating unit includes a wing member;

FIG. 11 is a second exemplary view for describing a shape of a flow resistance generating unit constituting a substrate treating apparatus according to an embodiment of the present disclosure when the flow resistance generating unit includes a wing member; and FIG. 12 is a third exemplary view for describing a shape of a flow resistance generating unit constituting a substrate treating apparatus according to an embodiment of the present disclosure when the flow resistance generating unit includes a wing member.

DETAILED DESCRIPTION

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical concept of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present disclosure belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

The present disclosure relates to a flow resistance generating unit that generates a flow resistance in a pipe to solve a flow imbalance problem due to a bent pipe and stabilizes an internal airflow, and a substrate treating apparatus including the same. Hereinafter, the present disclosure will be described in detail with reference to drawings and the like.

FIG. 1 is a schematic diagram exemplarily illustrating a structure of a substrate treating apparatus according to an embodiment of the present disclosure.

Referring to FIG. 1, a substrate treating apparatus 100 may be configured to include a housing 110, a lifting unit 120, a support unit 130, a heating member 140, a fluid supply unit 150, a blocking member 160, an exhaust member 170 and a flow resistance generating unit 180.

The substrate treating apparatus 100 may treat a substrate using a supercritical fluid. The substrate treating apparatus 100 may dry the substrate using, for example, carbon dioxide ($CO_2$) as a supercritical fluid.

The housing 110 provides a treating space, in which supercritical drying process is performed. The housing 110 may be made of a material capable of withstanding a high pressure greater than or equal to a critical pressure.

The housing 110 includes an upper module 111 and a lower module 112. The lower module 112 is provided in combination with the upper module 111 under the upper module 111. The space generated by the combination of the upper module 111 and the lower module 112 is provided as a treating space for performing a substrate treating process.

The upper module 111 is fixedly installed to the external structure. The lower module 112 is provided to be liftable with respect to the upper module 111. When the lower module 112 descends and is spaced apart from the upper module 111, a treating space inside the substrate treating apparatus 100 is opened. At this case, the substrate W may be brought into the internal space of the substrate treating apparatus 100 or may be carried out from the internal space.

The substrate W brought into the substrate treating apparatus 100 may be in a state, in which a substrate cleaning liquid (e.g., de-ionized (DI) water) remains. When the lower module 112 rises and comes into close contact with the upper module 111, the treating space is sealed inside the substrate treating apparatus 100. In the sealed treating space, a substrate may be treated through a supercritical fluid. Unlike the above-described example, a structure, in which the lower module 112 is fixedly installed in the housing 110 and the upper module 111 is liftable, may be provided.

The lifting unit 120 lifts the lower module 112. The lifting unit 120 includes a lifting cylinder 121 and a lifting rod 122. The lifting cylinder 121 is coupled to the lower module 112 to generate a vertical driving force. The lifting cylinder 121 generate a driving force that can overcomes a high pressure equal to or higher than the critical pressure inside the substrate treating apparatus 100 and brings the upper module 111 and the lower module 112 into close contact to seal the substrate processing apparatus 100 while the substrate is treated using the supercritical fluid. One end of the lifting rod 122 is inserted into the lifting cylinder 121 to extend vertically upward (in third direction 30), and the other end is coupled to the upper module 111.

When the driving force is generated in the lifting cylinder 121, the lifting cylinder 121 and the lifting rod 122 may be relatively lifted and the lower module 112 coupled to the lifting cylinder 121 may be lifted. While the lower module 112 is lifted by the lifting cylinder 121, the lifting rod 122 prevents the upper module 111 and the lower module 112 from moving in the horizontal direction (the first direction 10 or the second direction 20) and guides the lifting direction, so that the upper module 111 and the lower module 112 can be prevented from being separated from the proper position.

The support unit 130 is located in the treating space of the housing 110 and supports the substrate W. The support unit 130 is coupled to the upper module 111. The support unit 130 includes a vertical unit 131 and a horizontal unit 132.

The vertical unit 131 is provided extending downward from the upper wall of the housing 110. The vertical unit 131 is installed on the lower surface of the upper module 111. The vertical unit 131 is provided to extend downward of the upper module 111. The end of the vertical unit 131 is vertically coupled to the horizontal unit 132. The horizontal unit 132 is provided extending from the end of the vertical unit 131 to the inside of the housing 110. A substrate W is placed on the horizontal unit 132. The horizontal unit 132 supports the bottom surface of the edge region of the substrate W.

The support unit 130 contacts the edge region of the substrate W to support the substrate W, so that substrate treating through a supercritical fluid may be performed for the entire region of the upper surface of the substrate W and most of the region of the lower surface of the substrate W. Here, the upper surface of the substrate W may be a patterned surface and the lower surface of the substrate W may be a non-patterned surface.

The support unit 130 is installed on the upper module 111. The support unit 130 may support the substrate W relatively stably while the lower module 112 is lifted.

A horizontal adjustment member 113 is installed on the upper module 111, in which the support unit 130 is installed. The horizontal adjustment member 113 adjusts the horizontality of the upper module 111. The horizontality of the upper module 111 is adjusted, so that the horizontality of the substrate W seated on the support unit 130 installed in the upper module 111 is adjusted. When the upper module 111 is lifted and the lower module 112 is fixedly installed, or when the support unit 130 is installed in the lower module 112, the horizontal adjustment member 113 may be installed in the lower module 112.

The heating member 140 heats the inside of the substrate treating apparatus 100. The heating member 140 heats the supercritical fluid supplied into the substrate treating apparatus 100 to a critical temperature or higher to maintain the supercritical fluid phase. When the supercritical fluid is liquefied, the heating member 140 may heat the supercritical fluid to become the supercritical fluid again. The heating member 140 is installed to be embedded in the wall of at least one of the upper module 111 and the lower module 112. The heating member 140 receives power from the outside to generate heat. The heating member 140 may be provided as, for example, a heater.

The fluid supply unit 150 supplies a fluid to the substrate treating apparatus 100. The supplied fluid may be a supercritical fluid. As an example, the supplied supercritical fluid may be carbon dioxide.

The fluid supply unit 150 includes an upper fluid supply module 151, a lower fluid supply module 152, a supply pipe 153, and valves 154 and 155.

The upper fluid supply module 151 directly supplies the supercritical fluid to the upper surface of the substrate W. The upper fluid supply module 151 is provided connected to the upper module 111. The upper fluid supply module 151 is provided by being connected to the upper module 111 facing the center upper surface of the substrate W.

The lower fluid supply module 152 supplies the supercritical fluid to the lower surface of the substrate W. The lower fluid supply module 152 is provided connected to the lower module 112. The lower fluid supply module 152 is provided connected to the lower module 112 facing the center lower surface of the substrate W.

The supercritical fluid injected from the upper fluid supply module 151 and the lower fluid supply module 152 reaches the central region of the substrate W, spreads to the edge region, and is uniformly provided to the entire region of the substrate W.

The supply pipe 153 is connected to the upper fluid supply module 151 and the lower fluid supply module 152. The supply pipe 153 receives the supercritical fluid from the supercritical fluid storage unit 156 separately provided in the outside, and supplies the supercritical fluid to the upper fluid supply module 151 and the lower fluid supply module 152.

The valves 154 and 155 are installed in the supply pipe 153. A plurality of valves 154 and 155 may be provided in the supply line. Each of the valves 154 and 155 adjusts the flow rate of the supercritical fluid supplied to the upper fluid supply module 151 and the lower fluid supply module 152. Although not shown in FIG. 1, the valves 154 and 155 may adjust the flow rate supplied to the inside of the housing 110 by the control unit.

The fluid supply unit 150 may supply the supercritical fluid from the lower fluid supply module 152 first. Thereafter, the upper fluid supply module 151 may supply the supercritical fluid. The supercritical drying process may be initially performed in a state where the inside of the substrate treating apparatus 100 does not reach a critical pressure. When the inside of the substrate treating apparatus 100 does not reach the critical pressure, the supercritical fluid supplied to the inside may be liquefied. When the supercritical fluid is liquefied, it may fall to the substrate W by gravity to damage the substrate W.

Accordingly, the supercritical fluid is first supplied from the lower fluid supply module 152. After the supercritical fluid is supplied to the substrate treating apparatus 100, the internal pressure reaches the critical pressure. After the internal pressure of the substrate treating apparatus 100 reaches the critical pressure, the upper fluid supply module 151 supplies the supercritical fluid. By supplying the supercritical fluid from the lower fluid supply module 152 before the upper fluid supply module 151, it is possible to prevent the supercritical fluid from being liquefied and falling onto the substrate W.

The blocking member 160 prevents the supercritical fluid supplied from the fluid supply unit 150 from being directly injected onto the lower surface of the substrate W. The blocking member 160 includes a blocking plate 161 and a support 162.

The blocking plate 161 is located inside the housing 110, that is, in the treating space. The blocking plate 161 is disposed between the support unit 130 and the lower fluid supply module 152. The blocking plate 161 is provided in a shape corresponding to the substrate W. For example, the blocking plate 161 may be provided in a circular plate shape. The radius of the blocking plate 161 may be similar to or larger than that of the substrate W. The blocking plate 161 is located on the lower surface of the substrate W placed on the support unit 130 to prevent the supercritical fluid supplied through the lower fluid supply module 152 from being directly injected on the lower surface of the substrate W. When the radius of the blocking plate 161 is similar to or larger than that of the substrate W, it is possible to completely block the direct injection of the supercritical fluid to the substrate W.

Alternatively, the radius of the blocking plate 161 may be smaller than that of the substrate W. In this case, the supercritical fluid is blocked from being directly injected to the substrate W. In addition, the supercritical fluid can reach the substrate W relatively easily by reducing the flow rate of the supercritical fluid to a minimum. When the radius of the blocking plate 161 is provided to be smaller than that of the substrate W, the supercritical drying process for the substrate W may be effectively performed.

The support 162 supports the blocking plate 161. The support 162 supports the rear surface of the blocking plate 161. The support 162 is installed on the lower wall of the housing 110 and is provided in a vertical direction (in the third direction 30). The support 162 and the blocking plate 161 may be installed to be placed on the support 162 by gravity of the blocking plate 161 without separate coupling. Alternatively, the support 162 and the blocking plate 161 may be coupled by a coupling means such as a nut or bolt. Alternatively, the support 162 and the blocking plate 161 may be provided integrally.

The exhaust member 170 exhausts the supercritical fluid from the substrate treating apparatus 100. The exhaust member 170 may be connected to an exhaust line for exhausting the supercritical fluid. Although not shown in FIG. 1, in this case, a valve for adjusting the flow rate of the supercritical fluid exhausted to the exhaust line may be installed in the exhaust member 170.

The supercritical fluid exhausted through the exhaust line may be discharged to the atmosphere. Alternatively, the supercritical fluid may be supplied to the supercritical fluid regeneration system. The exhaust member 170 may be coupled to the lower module 112.

At a later stage of the substrate treating process using the supercritical fluid, the supercritical fluid may be exhausted from the substrate treating apparatus 100 and the internal pressure thereof may be reduced below the critical pressure to liquefy the supercritical fluid. The liquefied supercritical fluid may be discharged through the exhaust member 170 formed in the lower module 112 by gravity.

The flow resistance generating unit 180 generates a flow resistance in the supply pipe 153. As described above, when the substrate is dried using the supercritical fluid, the supply pipe 153 for supplying the supercritical fluid to the inside of the housing 110 is composed of a plurality of bent pipes. Therefore, when the supercritical fluid passes through a plurality of bent pipes and enters the upper fluid supply module 151, a phenomenon occurs, in which it moves toward one side, thereby causing a flow imbalance in the upper fluid supply module 151. When a flow imbalance phenomenon occurs in the upper fluid supply module 151, the drying of the developer applied to the substrate W may be non-uniformly dried due to the imbalanced flow field, and in this case, condensed particles may occur in the substrate W.

The flow resistance generating unit 180 may be installed in the supply pipe 153 to solve such a problem. Hereinafter, the flow resistance generating unit 180 will be described in detail.

FIG. 2 is a first exemplary diagram illustrating an arrangement structure of a flow resistance generating unit constituting a substrate treating apparatus according to an embodiment of the present disclosure.

The flow resistance generating unit 180 may be installed in the supply pipe 153 connecting the supercritical fluid storage unit 156 and the upper fluid supply module 151. However, the present embodiment is not limited thereto. The flow resistance generating unit 180 may be installed in the supply pipe 153 connecting the supercritical fluid storage unit 156 and the lower fluid supply module 152.

Hereinafter, a case, in which the flow resistance generating unit 180 is installed in the supply pipe 153 connecting the supercritical fluid storage unit 156 and the upper fluid supply module 151, will be described as an example, but it can be applied to a case in the same manner, in which even when the flow resistance generating unit 180 is installed in the supply pipe 153 connecting the supercritical fluid storage unit 156 and the lower fluid supply module 152.

Meanwhile, in the present embodiment, the supply pipe 153 may include a plurality of bent pipes. FIG. 2 shows that the supply pipe 153 includes three bent pipes 210*a*, 210*b*, and 210*c*, the number of bent pipes installed in the supply pipe 153 is not limited thereto, and may be two or more than four. Hereinafter, for convenience of description, a case, in which the number of bent pipes installed in the supply pipe 153 is three 210*a*, 210*b*, and 210*c*, will be described as an example.

When the supply pipe 153 connects the supercritical fluid storage unit 156 and the upper fluid supply module 151, the flow resistance generating unit 180 may be disposed adjacent to the upper fluid supply module 151. Specifically, when the supply pipe 153 includes a plurality of bent pipes 210*a*, 210*b*, and 210*c* to connect the supercritical fluid storage unit 156 and the upper fluid supply module 151, the flow resistance generating unit 180 may be disposed between the last bent pipe 210*c* and the upper fluid supply module 151. In the above, the last bent pipe 210*c* means a bent pipe located at the furthest distance from the supercritical fluid storage unit 156. Alternatively, the last bent pipe 210*c* means a bent pipe located at the closest distance from the upper fluid supply module 151. Alternatively, the last bent pipe 210*c* means a bent pipe, through which the supercritical fluid last passes among the plurality of bent pipes.

A single flow resistance generating unit 180 may be installed in the supply pipe 153. In this case, the flow resistance generating unit 180 may be disposed between the last bent pipe 210*c* and the upper fluid supply module 151 as described with reference to FIG. 2. However, the present embodiment is not limited thereto. A plurality of flow resistance generating units 180 may be installed in the supply pipe 153.

For example, when two flow resistance generating units 180 are installed in the supply pipe 153 as shown in FIG. 3, any one of the flow resistance generating units 180*b* may be disposed between the last bent pipe 210*c* and the upper fluid supply module 151 and the other flow resistance generating unit 180*a* may be disposed between the supercritical fluid storage unit 156 and the first bent pipe 210*a*. In the above, the first bent pipe 210*a* means a bent pipe located at the closest distance from the supercritical fluid storage unit 156. Alternatively, the first bent pipe 210*a* means a bent pipe located at the furthest distance from the upper fluid supply module 151. Alternatively, the first bent pipe 210*a* refers to a bent pipe, through which the supercritical fluid first passes among a plurality of bent pipes. FIG. 3 is a second exemplary diagram illustrating an arrangement structure of a flow resistance generating unit constituting a substrate treating apparatus according to an embodiment of the present disclosure.

Meanwhile, when two flow resistance generating units 180 are installed in the supply pipe 153, they may be disposed before and after the last bent pipe 210*c*.

On the other hand, when two flow resistance generating units 180 are installed in the supply pipe 153, any one of the flow resistance generating units 180*b* may be disposed between the last bent pipe 210*c* and the upper fluid supply module 151, and the other flow resistance generating unit 180*a* may be disposed between the last bent pipe 210*c* and the previous bent pipe 210*b*. That is, when two flow resistance generating units 180 are installed in the supply pipe 153, any one of the flow resistance generating units 180*b* may be disposed between the last bent pipe 210*c* and the upper fluid supply module 151, and the other flow resistance generating unit 180*a* may be disposed between two structures selected from the supercritical fluid storage unit 156, the first bent pipe 210*a*, the second bent pipe 210*b*, and the third bent pipe 210*c*.

Meanwhile, the flow resistance generating unit 180 may be disposed before and after the bent pipes 210*a*, 210*b*, and 210*c* as shown in FIG. 4. In this case, when the supply pipe 153 includes N bent pipes, N+1 flow resistance generating units 180 may be installed in the supply pipe 153 (where N is a natural number). FIG. 4 is a third exemplary view for describing an arrangement structure of a flow resistance generating unit constituting a substrate treating apparatus according to an embodiment of the present disclosure.

Meanwhile, a plurality of flow resistance generating units 180 may be continuously installed at the same location. For example, a plurality of flow resistance generating units 180 may be disposed between the last bent pipe 210*c* and the upper fluid supply module 151.

The flow resistance generating unit 180 may be provided as a flow restrictor to generate a flow resistance in the supply pipe 153. The flow resistance generating unit 180 may be provided as, for example, an orifice type structure, a multi-network pipe type structure, a buffer tank type structure, or the like.

When the flow resistance generating unit 180 is provided as an orifice type structure, as shown in FIG. 5, the flow resistance generating unit 180 may include an internal hole 220, through which the supercritical fluid may pass. FIG. 5 is a first exemplary view for describing a shape of a flow resistance generating unit constituting a substrate treating apparatus according to an embodiment of the present disclosure.

The inner hole 220 may include an upper hole 310, a middle hole 330, and a lower hole 320. Here, the width $w_1$ of the upper hole 310 is greater than the width $w_3$ of the middle hole 330 ($w_1 > w_3$), and the width $w_2$ of the lower hole 320 is also greater than the width $w_3$ of the middle hole 330 ($w_2 > w_3$).

When the inner hole 220 includes the upper hole 310, the middle hole 330, and the lower hole 320 having a change in width as described above, as shown in FIG. 6, after the supercritical fluid passes through the bottleneck section (the middle hole 330 in FIG. 5), it passes through a section wider than the bottleneck section (the lower hole 320 in FIG. 5). Therefore, it is possible to obtain the effect of resolving the phenomenon that the supercritical fluid is tilted to one side under the influence of the bent pipe 210. FIG. 6 is an exemplary view for describing an effect of a flow resistance generating unit constituting a substrate treating apparatus according to an embodiment of the present disclosure.

It will be described again with reference to FIG. 5.

The upper hole 310, the middle hole 330, and the lower hole 320 may be formed to have a constant width. However, the present embodiment is not limited thereto. The upper hole 310 may be formed to have a change in width within a range greater than the width $w_3$ of the middle hole 330. Similarly, the lower hole 320 may be formed to have a change in width within a range greater than the width $w_3$ of the middle hole 330. Meanwhile, the middle hole 330 may be formed to have a change in width within a range smaller than the minimum width of the upper hole 310 or the lower hole 320.

Meanwhile, the upper hole 310 and the lower hole 320 may be formed to have the same width. However, the present embodiment is not limited thereto. The upper hole 310 may be formed to have a greater width than the lower hole 320. Alternatively, the lower hole 320 may be formed to have a greater width than the upper hole 310.

When the flow resistance generating unit 180 includes the inner hole 220, the inner hole 220 may include an upper hole 310, a first middle hole 340, a second middle hole 350, a third middle hole 360, and a lower hole 320 as shown in FIG. 7. FIG. 7 is a second exemplary view for describing a shape of a flow resistance generating unit constituting a substrate treating apparatus according to an embodiment of the present disclosure.

The first middle hole 340 may be located below the upper hole 310. In this case, the second middle hole 350 may be located under the first middle hole 340. The first middle hole 340 may be formed in a direction, in which the width decreases. The first middle hole 340 may be formed in a direction, in which the width decreases by setting the same width $w_1$ as the upper hole 310 as the maximum width and the same width $w_3$ as the second middle hole 350 as the minimum width.

The third middle hole 360 may be located above the lower hole 320. In this case, the third middle hole 360 may be located below the second middle hole 350. The third middle hole 360 may be formed in a direction, in which the width increases. The third middle hole 360 may be formed in a direction, in which the width increases by setting the same width $w_3$ as the second middle hole 350 as the minimum width and the same width $w_2$ as the lower hole 320 as the maximum width.

When the flow resistance generating unit 180 is provided as an orifice type structure, various shapes of the internal hole 220 formed in the flow resistance generating unit 180 have been described with exampled with reference to FIGS. 5 and 7. In this embodiment, it is sufficient if the inner hole 220 formed inside the flow resistance generating unit 180 is formed in a form that is narrowed and then widened again so as to include the bottleneck section, and it should be noted that FIGS. 5 and 7 shows such a shape as examples.

On the other hand, although a single inner hole 220 may be formed, it is also possible to form a plurality of inner holes 220.

Next, a case, in which the flow resistance generating unit 180 is provided as a multi network pipe type structure, will be described.

FIG. 8 is a third exemplary view for describing a shape of a flow resistance generating unit constituting a substrate treating apparatus according to an embodiment of the present disclosure.

The flow resistance generating unit 180 may include a plurality of pipe members through which the supercritical fluid may move. In FIG. 8, the flow resistance generating unit 180 is illustrated as including four pipe members 410, 420, 430, 440, but the number of pipe members included in the flow resistance generating unit 180 is not limited thereto, and two or three, or five or more are also possible.

Hereinafter, a case, in which the flow resistance generating unit 180 includes four pipe members 410, 420, 430, and 440, will be described as an example.

The first pipe member 410, the second pipe member 420, the third pipe member 430, and the fourth pipe member 440 branch from the supply pipe 153, and they are rejoined before reach the upper fluid supply module 151.

The first pipe member 410, the second pipe member 420, the third pipe member 430, and the fourth pipe member 440 may be simultaneously branched from the supply pipe 153, but the present embodiment is not limited thereto. That is, in the present embodiment, at least one pipe member among the first pipe member 410, the second pipe member 420, the third pipe member 430, and the fourth pipe member 440 may branch off at a different point.

Similarly, the first pipe member 410, the second pipe member 420, the third pipe member 430 and the fourth pipe member 440 may be rejoined simultaneously before reaching the upper fluid supply module 151, but this embodiment is not limited thereto. That is, in the present embodiment, at least one pipe member among the first pipe member 410, the second pipe member 420, the third pipe member 430, and the fourth pipe member 440 may be rejoined at a different point.

The first pipe member 410, the second pipe member 420, the third pipe member 430, and the fourth pipe member 440 may be formed such that their inner holes have the same width. However, the present embodiment is not limited thereto. At least one pipe member of the first pipe member 410, the second pipe member 420, the third pipe member 430, and the fourth pipe member 440 may be formed so that its inner holes have different widths.

The first pipe member 410, the second pipe member 420, the third pipe member 430, and the fourth pipe member 440 may be formed to have the same width as the supply pipe 153. However, the present embodiment is not limited thereto. The first pipe member 410, the second pipe member 420, the third pipe member 430, and the fourth pipe member 440 may be formed to have a width different from that of the supply pipe 153. For example, the first pipe member 410, the second pipe member 420, the third pipe member 430, and the fourth pipe member 440 may be formed to have a greater width than the supply pipe 153, or may be formed to have a smaller width than the supply pipe 153.

Meanwhile, a single flow resistance generating unit 180 including a plurality of pipe members may be installed in the supply pipe 153. In this case, the flow resistance generating unit 180 including a plurality of pipe members may be disposed between the last bent pipe 210c and the upper fluid supply module 151 like the flow resistance generating unit 180 described with reference to FIG. 2.

A plurality of flow resistance generating units 180 including a plurality of pipe members may be installed in the supply pipe 153. In this case, the flow resistance generating unit 180 including a plurality of pipe members may be disposed similarly to the flow resistance generating unit 180 described with reference to FIGS. 3 and 4.

Next, a case, in which the flow resistance generating unit 180 is provided as a buffer tank type structure, will be described.

FIG. 9 is a fourth exemplary view for describing a shape of a flow resistance generating unit constituting a substrate treating apparatus according to an embodiment of the present disclosure.

When the flow resistance generating unit 180 is provided as a buffer tank type structure, its inner hole 450 may be formed to have a greater width than the inner hole of the supply pipe 153. In this case, the inner hole 450 of the flow resistance generating unit 180 may be formed to have a constant width, but may be formed to have a variable width. When the flow resistance generating unit 180 has an internal hole 450 whose size is variable, one end thereof, that is, a portion connected to the supply pipe 153, is formed to have a greater width than the internal hole of the supply pipe 153.

On the other hand, the other end of the flow resistance generating unit 180, that is, a portion connected to the upper fluid supply module 151, may also be formed to have a greater width than the inner hole of the upper fluid supply module 151, but the present embodiment is not limited thereto, and it also may be formed to have the same width as the inner hole of the upper fluid supply module 151.

Meanwhile, a single buffer tank type flow resistance generating unit 180 may be installed in the supply pipe 153. In this case, the buffer tank type flow resistance generating unit 180 may be disposed between the last bent pipe 210c and the upper fluid supply module 151 similar to the flow resistance generating unit 180 described with reference to FIG. 2.

A plurality of buffer tank type flow resistance generating units 180 may be installed in the supply pipe 153. In this case, the buffer tank type flow resistance generating unit 180 may be disposed similarly to the flow resistance generating unit 180 described with reference to FIGS. 3 and 4.

A case, in which the flow resistance generating unit 180 is provided as an orifice type structure, a multi network pipe type structure, or a buffer tank type structure, has been described above with reference to FIGS. 5 to 9. In the present embodiment, the flow resistance generating unit 180 is not limited thereto, and it is also possible to include a wing having a shape protruding into an empty space on its inner surface. Hereinafter, this will be described.

FIG. 10 is a first exemplary view for describing a shape of a flow resistance generating unit constituting a substrate treating apparatus according to an exemplary embodiment of the present disclosure when the flow resistance generating unit includes a wing member.

According to FIG. 10, in the flow resistance generating unit 180, an empty space, that is, a hole 510 is formed inside the body 530, and the wing member 520 may be formed in a shape protruding from the inner surface of the body 530 to an empty space. At this time, the wing member 520 may be formed to extend in the downward direction (in the third direction 30) along the circumference of the inner surface like a screw thread shape.

When the flow resistance generating unit 180 having the inner hole 510 is formed by including the wing member 520 having such a shape in the inner hole 510, the supercritical fluid may move along the wing member 520 and generate a vortex, and the effect of uniformizing the flow of the supercritical fluid discharged to the substrate W can be obtained by suppressing the flow and inducing the flow of the supercritical fluid.

On the other hand, the flow resistance generating unit 180 is also possible to generate a vortex through a groove that is formed extending in the downward direction (in the third direction 30) along the circumference of the inner surface like a screw thread shape.

When a single wing member 520 is formed in the inner hole 510 of the body 530, it may be formed as shown in FIG. 10. However, the present embodiment is not limited thereto. A plurality of wing members 520 may be formed in the inner hole 510 of the body 530. Hereinafter, this will be described.

FIG. 11 is a second exemplary view for describing a shape of a flow resistance generating unit constituting a substrate treating apparatus according to an embodiment of the present disclosure when the flow resistance generating unit includes a wing member, and FIG. 12 is a third exemplary view for describing a shape of a flow resistance generating unit constituting a substrate treating apparatus according to an embodiment of the present disclosure when the flow resistance generating unit includes a wing member.

In FIGS. 11 and 12, a case, in which the wing member 520 is composed of four wings 520a, 520b, 520c, and 520d, will be described as an example, but the present embodiment is not limited thereto, and the wing member 520 may comprise two or three wings, or five or more wings.

The first wing 520a, the second wing 520b, the third wing 520c and the fourth wing 520d may be formed along the inner surface of the body 530 in a state spaced apart from each other, in this case, the first wing 520a, the second wing 520b, the third wing 520c and the fourth wing 520d may be disposed to surround the inner hole 510.

The first wing 520a, the second wing 520b, the third wing 520c, and the fourth wing 520d may be formed to descend in a stepwise fashion (i.e., in the third direction 30) along the inner surface of the body 530. In FIGS. 11 and 12, four wings 520a, 520b, 520c, 520d are shown as being formed individually on the inner surface of the body 530, respectively, these four wings 520a, 520b, 520c, 520d may be repeatedly formed in the third direction 30 to be formed in plural on the inner surface of the body 530.

Even when the wing member 520 is composed of a plurality of wings in this way, it is possible to obtain the same effect as in the case of FIG. 10 according to the arrangement according to FIGS. 11 and 12.

Meanwhile, the wing member 520 may be installed inside the flow resistance generating unit 180, but the present embodiment is not limited thereto. For example, the wing member 520 may be installed in the supply pipe 153 adjacent to the upper fluid supply module 151 or may be installed in the upper fluid supply module 151. In this case, the flow resistance generating unit 180 may not be included in the substrate treating apparatus 100.

In addition, the wing member 520 is not limited to be installed in any one position selected from the inside of the flow resistance generating unit 180, the inside of the supply pipe 153 adjacent to the upper fluid supply module 151, and the inside of the upper fluid supply module 151, and it may be installed in at least two positions.

Meanwhile, the wing member 520 may rotate along the inner surface of the body 530 to generate a vortex phenomenon in the supercritical fluid.

Meanwhile, as described above, the flow resistance generating unit 180 described with reference to FIGS. 2 to 12 can be applied to the supply pipe 153 interconnecting the supercritical fluid storage unit 156 and the lower fluid supply module 152 in the same method.

On the other hand, it is also possible to continuously install a plurality of flow resistance generating units 180 at the same position.

The flow resistance generating unit 180 and the substrate treating apparatus 100 including the same have been described above with reference to FIGS. 1 to 12. The characteristics of the flow resistance generating unit 180 in the present disclosure are summarized once again as follows.

First, in the conventional supply pipe, flow imbalance and periodic flow shaking due to the bent pipe occur. In the present disclosure, the flow resistance generating structure, that is, the flow resistance generating unit 180, is inserted to generate flow resistance in the supply pipe 153, so that the internal airflow can be stabilized by inducing the airflow to be uniformly mixed.

The flow resistance generating unit 180 may be provided as a flow restrictor. For example, it may be provided as an orifice type structure, a multi-network pipe type structure, or a buffer tank type structure.

When the flow resistance generating unit 180 is provided as an orifice type structure, it may be installed a position after the last bent pipe supplied to the vessel, or at two positions before and after the last bent pipe. In the present disclosure, the flow resistance generated thereby can improve the flow movement in the pipe and evenly distribute the flow of the supercritical fluid on the wafer surface.

On the other hand, as a deformable structure of the orifice, a multi hole structure, a mesh structure, a lattice structure, etc. are possible, and the range of orifice sizes that can be used in connection with a supercritical vessel is, for example, 0.002 in to 0.1 in, or 0.05 mm to 2.4 mm.

In addition, when the flow resistance generating unit 180 is provided as a multi-network pipe type structure, the pipe supplied to the vessel may be configured as a multi-pipe to improve the flow movement with a network, in which the flow is branched and then re-merged.

In addition, when the flow resistance generating unit 180 is provided as a buffer tank type structure, a buffer tank is configured in the pipe supplied to the vessel to change the speed and pressure of the supercritical fluid in the buffer tank so that the flow of the supercritical fluid on the wafer surface can be evenly distributed.

Second, the supercritical fluid (for example, $CO_2$ airflow) that has passed through the bent pipe improves flow bias, and accordingly, the flow imbalance (asymmetric flow field) can also be improved in the airflow injected to the upper and lower portions of the wafer in the vessel through the bent pipe, and the supercritical fluid discharge unit (in the present disclosure, the upper fluid supply module 151 and the lower fluid supply module 152).

Third, when the developer applied to the surface of the wafer is dried, the developer can be dried uniformly without forming a flocking particle stain-mark in the shape of a flow field formed on the wafer surface of particles.

The flow resistance generating unit 180 and the substrate treating apparatus 100 including the same described above with reference to FIGS. 1 to 12 may be applied to a facility that performs a drying process during a semiconductor device manufacturing process. Specifically, the flow resistance generating unit 180 and the substrate treating apparatus 100 including the same may be applied to a facility that performs a photo process (e.g., a developing process).

Although embodiments of the present disclosure have been described with reference to the above and the accompanying drawings, those skilled in the art, to which the present disclosure pertains, can understand that the present disclosure may be practiced in other specific forms without changing its technical concept or features. Therefore, it should be understood that the embodiments described above are illustrative in all respects and not limiting.

What is claimed is:

1. An apparatus for treating a substrate comprising:
a housing;
a support unit installed in the housing and for supporting a substrate from both sides;
a heating member installed on a sidewall of the housing and for generating heat for treating the substrate;
a fluid supply unit for supplying fluid for treating the substrate to an inside of the housing and including an upper fluid supply module for supplying the fluid to an upper portion of the substrate, a lower fluid supply module for supplying the fluid to a lower portion of the substrate, and a supply pipe connected to at least one of the upper fluid supply module and the lower fluid supply module;

a flow resistance generating unit installed in the supply pipe and for generating a flow resistance with respect to the fluid passing through the supply pipe; and a wing member that rotates the fluid and that is formed in an inner hole of at least one of the flow resistance generating unit, the supply pipe, the upper fluid supply module, or the lower fluid supply module, and wherein the flow resistance generating unit is provided between a bent pipe included in the supply pipe and the upper fluid supply module, or is provided between the bent pipe and the lower fluid supply module.

2. The apparatus of claim 1, wherein the flow resistance generating unit generates a flow resistance with respect to fluid passing through the bent pipe and directed to the upper fluid supply module or the lower fluid supply module.

3. The apparatus of claim 1, wherein the flow resistance generating unit is provided between a bent pipe adjacent to the upper fluid supply module and the upper fluid supply module in response to the bent pipe being plural, or is provided between a bent pipe adjacent to the lower fluid supply module and the lower fluid supply module in response to the bent pipe being plural.

4. The apparatus of claim 1, wherein the flow resistance generating unit generates a flow resistance with respect to the fluid by limiting a flow rate of the fluid.

5. The apparatus of claim 1, wherein the flow resistance generating units are provided in plural.

6. The apparatus of claim 5, wherein the flow resistance generating units are respectively provided before and after the bent pipe.

7. The apparatus of claim 1, wherein the flow resistance generating unit comprises, a body; and the inner hole of the flow resistance generating unit is formed inside the body, wherein a width of the inner hole is variable.

8. The apparatus of claim 7, wherein the inner hole includes a bottleneck section.

9. The apparatus of claim 7, wherein a width of the inner hole decreases toward a center and increases toward both ends.

10. The apparatus of claim 1, wherein the flow resistance generating unit is provided as any one of an orifice type structure, a multi-pipe type structure, and a buffer tank type structure.

11. The apparatus of claim 10, wherein, in response to the flow resistance generating unit being provided as an orifice type structure, the flow resistance generating unit has an internal hole including a bottleneck section.

12. The apparatus of claim 10, wherein, in response to the flow resistance generating unit being provided as a multi-pipe type structure, the flow resistance generating unit is rejoined after branching.

13. The apparatus of claim 10, wherein, in response to the flow resistance generating unit being provided as a buffer tank type structure, the flow resistance generating unit has an inner hole having a width greater than that of the supply pipe.

14. The apparatus of claim 1, wherein the flow resistance generating unit comprises, a body;

the inner hole of the flow resistance generating unit is formed inside the body; and the wing member protruding from an inner surface of the body.

15. The apparatus of claim 14, wherein the wing member is formed to extend from one end of the body to the other end along an inner circumference of the body.

16. The apparatus of claim 14, wherein the wing member is provided in plural, wherein the plurality of wing members are provided to be spaced apart from an inner surface of the body, and are provided at different heights.

17. The apparatus of claim 1, wherein the fluid is a supercritical fluid.

18. An apparatus for treating a substrate comprising:

a housing;

a support unit installed in the housing and for supporting a substrate from both sides;

a heating member installed on a sidewall of the housing and for generating heat for treating the substrate;

a fluid supply unit for supplying fluid for treating the substrate to an inside of the housing and including an upper fluid supply module for supplying the fluid to an upper portion of the substrate, a lower fluid supply module for supplying the fluid to a lower portion of the substrate, and a supply pipe connected to at least one of the upper fluid supply module and the lower fluid supply module;

a flow resistance generating unit installed in the supply pipe and for generating a flow resistance with respect to the fluid passing through the supply pipe; and a wing member that rotates the fluid and that is formed in an inner hole of at least one of the flow resistance generating unit, the supply pipe, the upper fluid supply module, or the lower fluid supply module, wherein the flow resistance generating unit is provided between a bent pipe included in the supply pipe and the upper fluid supply module and generates a flow resistance with respect to fluid passing through the bent pipe and directed to the upper fluid supply module, or is provided between the bent pipe and the lower fluid supply module and generates a flow resistance with respect to fluid passing through the bent pipe and directed to the lower fluid supply module, wherein the flow resistance generating unit is provided as any one of an orifice type structure, a multi-pipe type structure, and a buffer tank type structure, wherein, in response to the flow resistance generating unit being provided as an orifice type structure, the flow resistance generating unit has an inner hole including a bottleneck section, wherein, in response to the flow resistance generating unit being provided as a multi-pipe type structure, the flow resistance generating unit is rejoined after branching, and wherein, in response to the flow resistance generating unit being provided as a buffer tank type structure, the flow resistance generating unit has an inner hole having a width greater than that of the supply pipe.

19. A flow resistance generating unit comprising:

a body; and an inner hole formed inside the body wherein the flow resistance generating unit is provided in a supply pipe for supplying the fluid to an inside of a housing of an apparatus for treating a substrate, in which the substrate is disposed, to treat the substrate, wherein the flow resistance generating unit is provided between a bent pipe included in the supply pipe and a fluid supply module installed in the housing for transferring the fluid to an upper portion and a lower portion of the substrate and generates a flow resistance to fluid passing through the bent pipe and directed to the fluid supply module, wherein the flow resistance generating unit generates a flow resistance with respect to the fluid by limiting a flow rate of the fluid through a change in a width of the inner hole, and wherein a wing member that rotates the fluid is formed in an inner hole of at least one of the flow resistance generating unit, the supply pipe, or the fluid supply module.

* * * * *